United States Patent [19]
Cunningham

[11] 3,974,452
[45] Aug. 10, 1976

[54] BATTERY POWERED SCANNING RECEIVER WITH SYNCHRONOUS POWER CYCLING THROUGH ELECTRICALLY OPERABLE VISUAL INDICATORS

[75] Inventor: Charles Cunningham, Indianapolis, Ind.

[73] Assignee: Regency Electronics, Inc., Indianapolis, Ind.

[22] Filed: Sept. 6, 1974

[21] Appl. No.: 503,748

[52] U.S. Cl. .............................. 325/470; 325/492; 334/86
[51] Int. Cl.² .......................................... H04B 1/32
[58] Field of Search .......................... 325/492–495, 325/455, 470, 398, 463–469; 334/86, 87

[56] References Cited
UNITED STATES PATENTS

| | | |
|---|---|---|
| 3,509,468 | 4/1970 | Overlie .............................. 325/478 |
| 3,599,100 | 8/1971 | Ward .................................. 325/492 |
| 3,665,318 | 5/1972 | Hoffman ............................. 325/470 |
| 3,919,646 | 11/1975 | Morgan .............................. 325/470 |

*Primary Examiner*—Robert L. Griffin
*Assistant Examiner*—Robert Hearn
*Attorney, Agent, or Firm*—Woodard, Weikart, Emhardt & Naughton

[57] ABSTRACT

A receiver is disclosed for signal-seeking operation on a plurality of channels. The receiver uses power cycling of the RF amplifier stage, mixers, local oscillators and intermediate frequency amplifiers which is in synchrony with the electronic stepping switch used to sequence among the channels. The power which is cycled to these portions of the receiver passes in series through light emitting diode channel indicators.

21 Claims, 3 Drawing Figures

BATTERY POWERED SCANNING RECEIVER WITH SYNCHRONOUS POWER CYCLING THROUGH ELECTRICALLY OPERABLE VISUAL INDICATORS

BACKGROUND OF THE INVENTION

1. Field of the Invention

The present invention relates to signal-seeking receivers and more particularly to receivers which apply power to certain portions thereof intermittently to conserve power.

2. Description of the Prior Art

Portable and other battery powered signal-seeking radio receivers which tune sequentially to a plurality of signals and which have indicator lights corresponding to each of the channels are known in the art. These receivers suffer from high current drain because of their large power requirements and therefore, require rather frequent replacement or recharging of the batteries on which they operate. Their basic circuit design is patterned after circuits such as are shown in U.S. Pat. No. 3,665,318 to Hoffman and Schonegg and U.S. Pat. No. 3,714,585 to Richard C. Koch.

Other receivers are known for operation on a single frequency or for operation on a manually selected one of a plurality of frequencies and which use the technique of only intermittently applying power to certain portions of the receiver in order to conserve power. These circuits work admirably for providing a single frequency monitor with a low current drain. However, these receivers do not provide electrically operated visual indicators to let the operator know readily the channel to which the receiver is tuned, nor do they provide automatic monitoring of two or more channels.

SUMMARY OF THE INVENTION

The present invention relates to improvements in battery operable multi-frequency signal-seeking receivers which relate to two separate aspects. One aspect relates to the positioning of electrically operable visual indicators in series with certain portions of the circuit of the receiver whereby the energy which would normally be dissipated in a dropping resistor to achieve a required filtered or regulated voltage is used to provide a visual indication to the operator of the receiver. Another aspect of the invention relates to the power cycling of certain portions of the receiver in synchrony with the sequencing among channels in the signal-seeking operation, whereby the signal-seeking function is not interfered with by the power cycling operation and both can be derived from common circuitry.

As a result of the invention, the power requirements for a portable, battery powered, receiver having a visual indicator associated with each channel can be appreciably reduced. This can provide either a longer operation of the receiver or a smaller requirement for battery supply for the receiver. While the above summary may be of some assistance in understanding the invention, it should be understood that the precise scope of the present invention is defined and set forth only in the claims.

Other objects and advantages of the invention will become apparent as the description proceeds.

DESCRIPTION OF THE PREFERRED EMBODIMENT

Figure 2A:
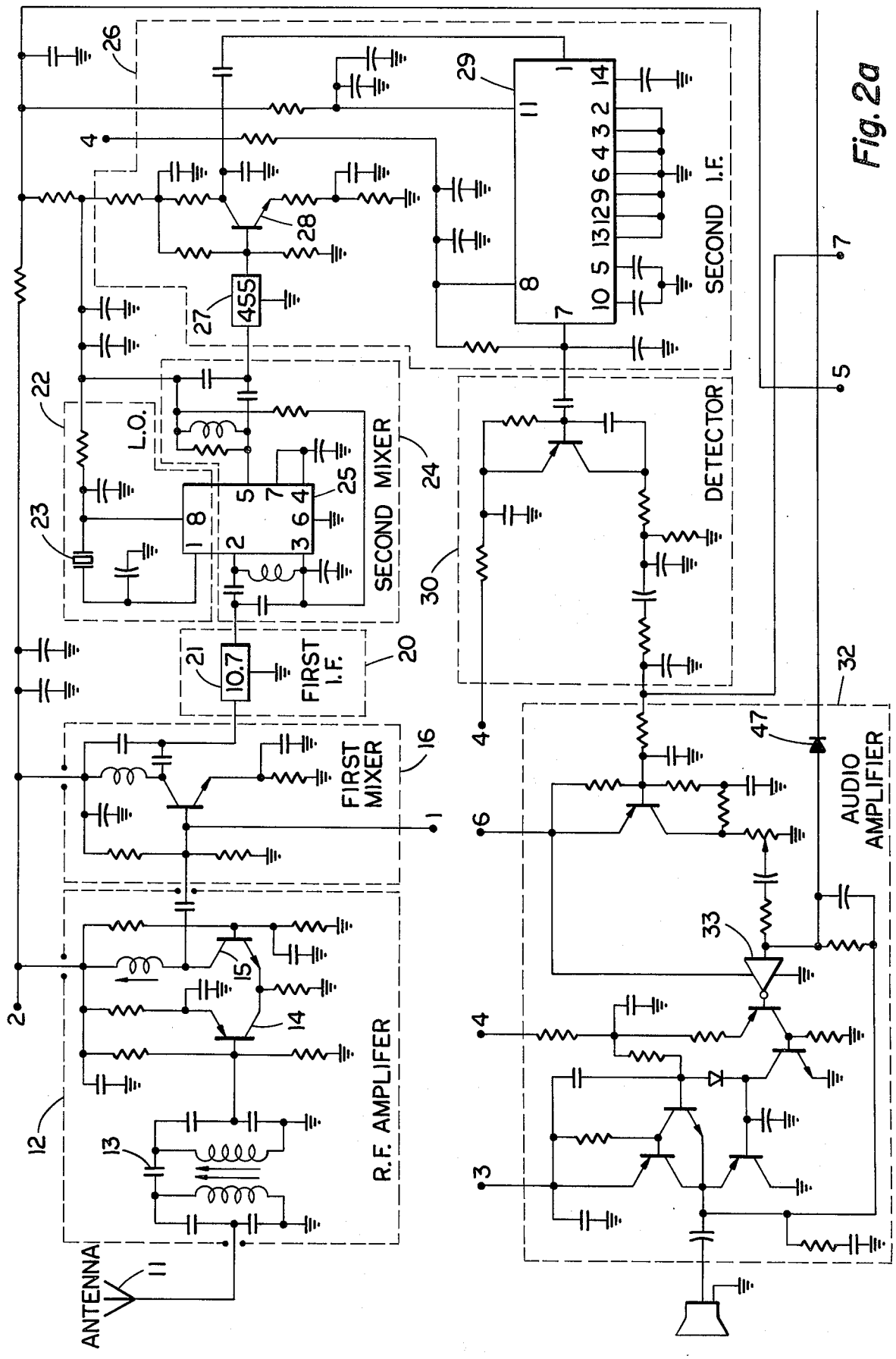
FIGS. 2a and 2b together constitute a diagram of the embodiment of FIG. 1, FIG. 2a representing generally the upper portion of FIG. 1 and FIG. 2b representing generally the lower portion of FIG. 1. The numbered points 1–8 designate points of interconnection between the circuits shown in FIG. 2a and FIG. 2b.
Figure 2B:
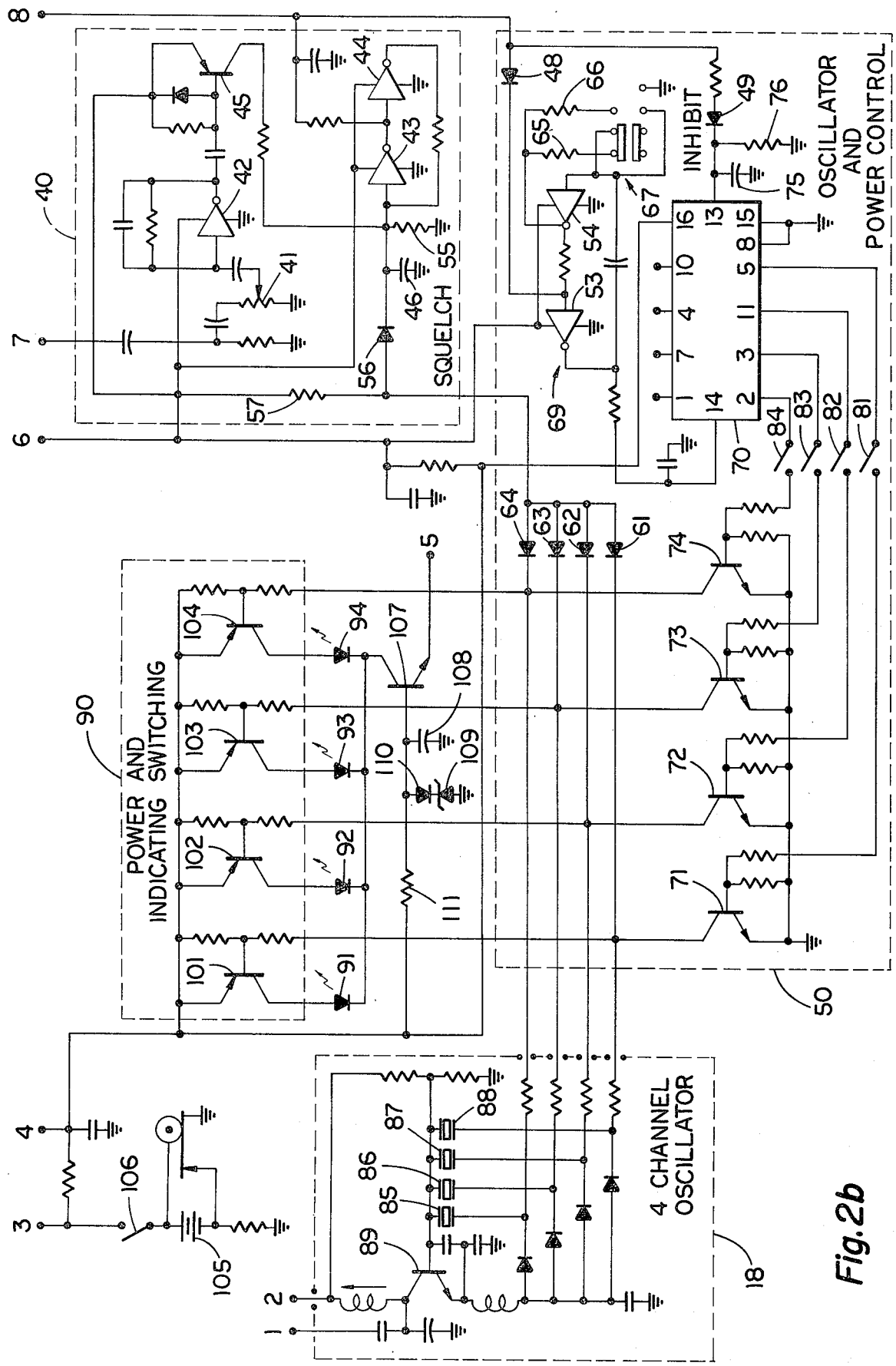

Referring to the drawings, circuitry is illustrated for a radio receiver of the superheterodyne type, and more specifically a receiver adapted to receive frequency modulated signals. The receiver has an RF signal receiving means which includes an antenna 11 which connects to an RF amplifier 12. The RF amplifier is of conventional design having a band pass filter 13 and two transistors 14 and 15 in an amplifying stage to amplify RF signals to a desired level for use in the first mixer 16. First mixer 16 is coupled to the local oscillator 18 (through point 1 on FIGS. 2a and 2b) as well as to the radio frequency amplifier and it functions to mix the received radio frequency signals with local oscillations from local oscillator 18. As a result of the mixing process, intermediate frequencies are produced. These frequencies are filtered in the first IF 20 which includes a ceramic filter 21 operating at 10.7 MHz.

The output of this first IF is the mixed in a similar manner as previously described with a signal from local oscillator 22 in a second mixer 24. The frequency of local oscillator 22 is determined by a crystal 23. An integrated circuit 25 is used which preferably is SC 5282 P manufactured by Motorola, Inc., Franklin Park, Illinois, connected with the pin designations as numerically shown in FIG. 2a. The output of the second mixer 24 passes to a second intermediate frequency stage 26 which includes a 455 kHz ceramic filter 27. The output of ceramic filter 27 is amplified by a transistor amplifying stage which includes transistor 28 and by an integrated circuit 29 which is preferably MC 1355 P made by Motorola, Inc. and connected with its pin arrangements as shown numerically in FIG. 2a. The output of integrated circuit 29 passes to detector 30 where audio frequency signals are produced corresponding to the frequency modulation of the intermediate frequency signals from the second IF 26.

The output of detector 30 is amplified by an audio amplifier 32 which includes an integrated circuit inverter 33 which is part of a package of six identical inverters commonly referred to as a hex inverter, such as National's MM 74CO4N. The output of audio amplifier 32 connects to a coventional speaker 34 in which the audio frequency electrical signals are converted to audio frequency sound for listening.

The first IF 20, local oscillator 22, second mixer 24, second IF 26 and detector 30 serve to convert modulation information contained in the IF signal produced by mixer 16 to audio frequency signals. The modulation generally contains speech information when signals are being received and merely noise when no signals are being received. A squelch circuit 40 attached to the output of detector 30 includes conventional noise activated circuitry which is responsive to the amount of audio frequency noise at the output of detector 30. If when the receiver is fully and actively operating, the amount of audio frequency noise is below a threshold value, then the audio amplifier 32 is not muted. Otherwise, the audio amplifier 32 is muted. The threshold value can be adjusted by potentiometer 41. Three inverters 42, 43 and 44 are part of the hex inverter package previously referred to. Squelch circuit 40 functions not only to mute audio, but also as a locking means which is connected to the oscillator and power control circuit 50 for defeating the automatic operation of that circuit as long as an RF signal is being received and allowing resumption of operation when no RF signal is being received. While RF is not directly detected by this circuit, it is known to use audio noise level as an indicator of the presence of RF. It has been found that for many reasons noise operated squelch is more desirable, but will function in an essentially equivalent manner to RF or IF carrier level detection squelch.

In squelch circuit 40, inverter 42 serves as a noise amplifier whose output passes through a rectifying amplifier stage including transistor 45 to produce a filtered noise indicating signal on capacitor 46. An amount of hysteresis is introduced into this noise indicating signal by the arrangement of inverting amplifiers 43 and 44 in a Schmitt trigger configuration to provide an element of stability in the action of squelch circuit 40. The output of squelch circuit 40 feeds through diode 47 in audio amplifier 32 to defeat the action of the audio amplifier and feeds through diode 48 to defeat the operation of a clocking oscillator 69 in oscillator and power control circuit 50 which includes inverting amplifiers 53 and 54.

The squelch signal also passes through diode 49 to inhibit operation of an integrated circuit 70 which functions to sequence the four channel oscillator 18 among its four frequencies.

Transistor 45 and its associated stage tends to charge capacitor 46 in response to noise received from the inverting amplifier 42. Resistor 55 tends to discharge capacitor 46 in competition with the charging action of transistor 45. Depending upon the noise level and the adjustment of potentiometer 41, the voltage on capacitor 46 is either sufficient or insufficient to operate the Schmitt trigger configuration of inverting amplifiers 43 and 44. A diode 56 also connects to capacitor 46 and provides a path for charging the capacitor from the supply voltage through resistor 57. So long as capacitor 46 is charging through diode 56 and resistor 57, capacitor 46 will maintain a sufficient charge to cause the audio amplifier to be muted and the clocking oscillator 69 to continue in operation. However, the charging of capacitor 46 through diode 56 cannot occur when any one of diodes 61 through 64 are conducting as occurs when any one of the four channels of the four channel oscillator is conducting current to ground. This will occur when any of the channels of the four channel oscillator are turned on by operation of transistors 71 through 74. These transistors 71–74 operate in response to channel programming switches 81–84 and integrated circuit 70 which preferably is a Motorola integrated circuit MC 14022.

Integrated circuit 70 is an eight output electronic sequencing circuit which is connected to the clocking oscillator 69 which serves to sequence the stepping circuit sequentially through its eight outputs. A capacitor 75 and a discharge resistor 76 connect to a pin 13 of integrated circuit 70 to inhibit the operation of the integrated circuit during the time that the receiver is unsquelched and for a brief time period thereafter. Four of the outputs of the eight output automatic stepping circuit which includes integrated circuit 70 and clock 69 do not connect to anything. These outputs correspond to pins 1, 4, 7 and 10. The other four outputs, pins 2, 3, 5 and 11 connect through switches 81 through 84 to transistors 71 through 74. It can be observed that the use of an eight position counter for a four frequency receiver results in a maximum duty cycle of 50% in turning on transistors 71 through 74. The duty cycle reduces correspondingly according to the number of switches 81 through 84 which are left open to delete the corresponding channels from the scanning process. The switched outputs of transistors 71 through 74 serve as the output of the oscillator and power control circuit 50 and function not only to sequence the four channel oscillator 18 among its four frequencies but also to control the power and indicating switching 90. It may be noted that the four channel oscillator 18 uses four crystals 85 through 88 as the frequency determining elements to provide, in conjunction with transistor 89 and its associated circuitry, frequencies corresponding to the different desired channels.

Clocking oscillator 69 is controlled not only automatically by the operation of the squelch but also manually with switch 67. Switch 67 is a three position slide switch. In the left position illustrated, the clocking oscillator operates at about 20 cycles per second, the frequency being determined by the value of resistor 65. In the center position of switch 67, resistor 66 is substituted for resistor 65 to cause slow operation of the clocking oscillator at about 2 cycles per second. The right position of switch 67 defeats the clocking oscillator 69 to allow single channel use of the receiver. To use the receiver on a single channel, switch 67 is placed in its center position until the receiver has sequenced to the desired channel at which time switch 67 is placed in the right position.

The power and indicating switching circuit 90 includes four transistors 101 through 104 which are controlled by transistors 71 and 74 which in turn are controlled by integrated circuit 70 through switches 81 through 84. Transistors 101 through 104 are controlled to intermittently supply power to portions of the radio receiver at a periodic rate and at a maximum duty cycle of 50%. The power supply in this receiver is a battery 105 which is connected to the circuitry through a switch 106 when it is desired to operate the receiver. Four light emitting diodes 91 through 94 are used to indicate which of the four channels the receiver is actively tuning to. Each of the light emitting diodes 91 through 94 have a first lead which connects to its cathode and second lead which connects to its anode. The second lead of each of the light emitting diodes connects to a corresponding one of transistors 101 through 104 in the power and indicating switching circuit 90. Each of the first leads of light emitting diodes 91 through 94 connect to each other and to the collector of a junction transistor 107 in a voltage regulating transistor circuit which includes a capacitor 108, a Zener diode 109, a diode 110 and a resistor 111. The voltage regulating transistor 107 is connected in a series configuration with the light emitting diodes and the power supply leads to a large portion of the receiver circuitry. The Zener diode 109 coupling to the base of transistor 107 serves to regulate the voltage at the emitter of transistor 107.

Figure 1:
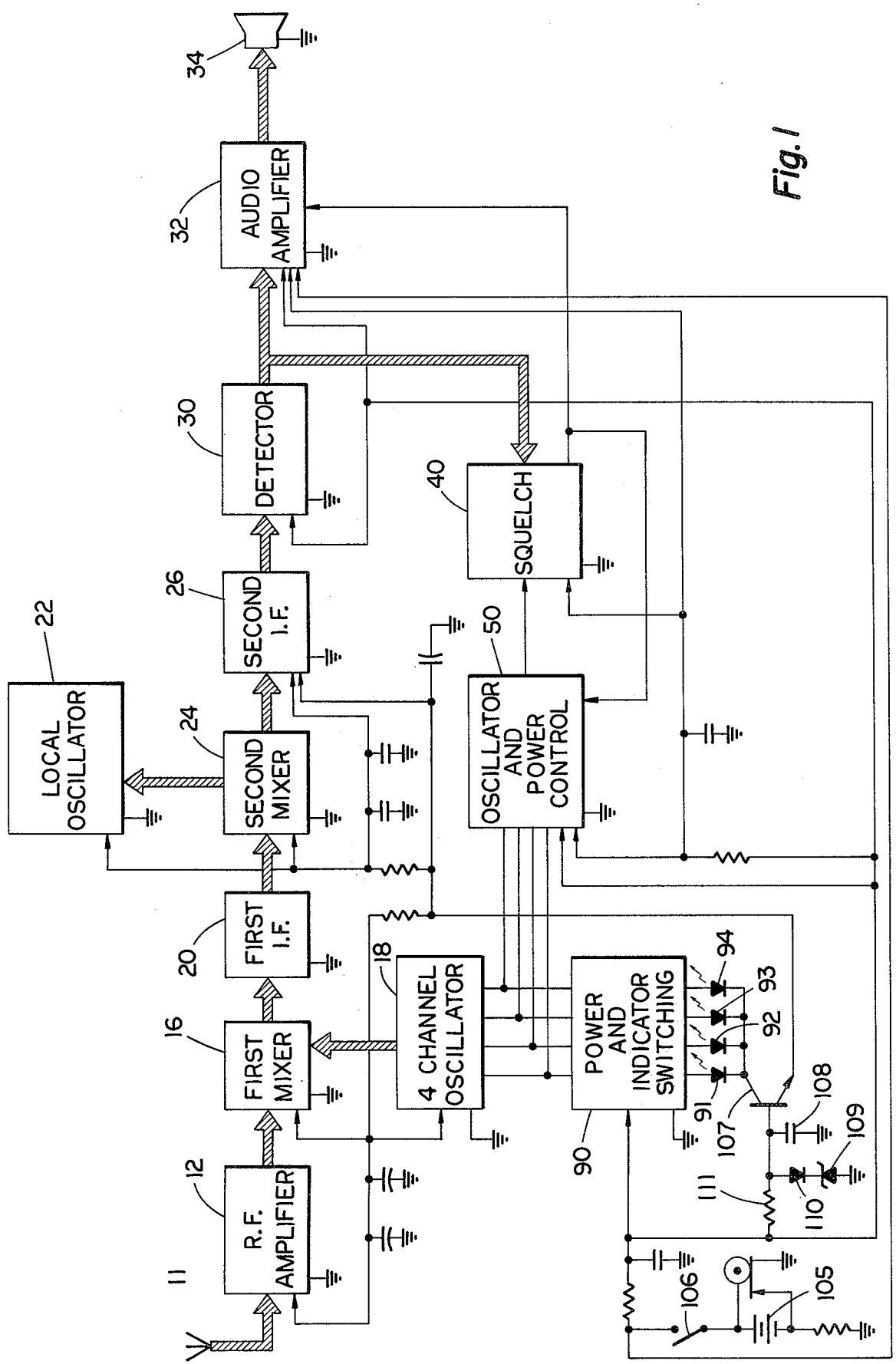
FIG. 1 is a block diagram of the preferred embodiment of this invention.

As can be observed most easily by reference to FIG. 1, it can be observed that the power supply to radio frequency amplifier 12, first mixer 16, four channel oscillator 18, local oscillator 22, second mixer 24, and second IF 26 is supplied through transistor 107 and through one of the light emitting diodes 91 through 94. The precise one of the diodes through which the power is supplied depends upon the channel to which the receiver is tuned. The circuitry including oscillator and power control 50 and power and indicating switching 90 serves to sequentially connect the light emitting diodes 91 through 94 one at a time in series with the circuitry of a large portion of the receiver. In addition, the nature of the oscillator and power control circuit 50 is such that the same large portion of the receiver is cycled on and off periodically to result in a maximum duty cycle of 50%. This circuitry arrangement serves to conserve power from the battery and permits the signal-seeking function to continue without interference. Since this preferred embodiment is a portable receiver in which the battery supply permitting the receiver to operate comes solely from batteries placed within the receiver, energy consumption of the receiver is very important for long life, light weight and small construction dimensions.

While there have been described above the principles of this invention in connection with specific apparatus, it is to be clearly understood that this description is made only by way of example and not as a limitation to the scope of the invention.

What is claimed is:

1. In a multi-frequency signal-seeking receiver of the superheterodyne type which includes:
   a. local oscillator means having a plurality of frequency determining means for providing local oscillations of different frequencies corresponding to different channels:
   b. RF and IF signal handling means consisting of:
      1. A mixer coupled to said local oscillator for mixing received radio frequency signals with the local oscillations from said local oscillator means,
      2. RF signal receiving means for providing sufficient RF signal level for said mixer and
      3. IF and detector means for converting modulated intermediate frequency signals produced by said mixer to audio frequency signals;
   c. audio means for converting said audio frequency signals to sound for listening;
   d. a plurality of electrically operable visual indicators, there being one visual indicator associated with each of said frequency determining means;
   e. automatic stepping means which is defeatable and which has a plurality of outputs which are coupled to said oscillator means for automatically stepping said oscillator means through said given plurality of frequency determining means and operating each of said visual indicators when its associated frequency determining means is operative;
   f. locking means which is connected to the automatic stepping means for defeating said automatic stepping means as long as an RF signal is being received and allowing resumption of operation of said stepping means when no signal is being received;
   g. squelch means for muting said audio means during automatic operation of said stepping means; and
   h. battery supply means for permitting the entire receiver to operate from batteries, the improvement which comprises means for sequentially connecting said plurality of electrically operable visual indicators one at a time in series with the battery supply connection to at least a portion of said RF and IF signal handling means to provide power thereto.

2. The receiver of claim 1 in which said visual indicators include means for producing visible light when energized.

3. The receiver of claim 2 in which said visual indicators are light emitting diodes.

4. The receiver of claim 3 in which each of said light emitting diodes has a first and a second lead, the first leads of each of said light emitting diodes connecting to a common point.

5. The receiver of claim 4 which additionally includes a voltage regulating transistor circuit which is connected to the first leads of each of said light emitting diodes in a series configuration.

6. The receiver of claim 5 in which said means for sequentially connecting sequentially connects said plurality of light emitting diodes in series with said RF signal receiving means, said mixer, and said IF and detector means.

7. The receiver of claim 6 which additionally includes a plurality of switching transistors and in which the second lead of each of said light emitting diodes connects to one of said switching transistors.

8. The receiver of claim 7 in which said voltage regulating transistor circuit has a Zener diode and a junction transistor with a base to which the Zener diode is coupled.

9. The receiver of claim 8 in which the first lead of said light emitting diodes connects directly to the cathode and the second lead of said light emitting diodes connects directly to the anode of said light emitting diodes.

10. The receiver of claim 9 which additionally includes means for power cycling said RF signal receiving means, said mixer and said IF and detector means in synchrony with said automatic stepping means.

11. In a multi-frequency signal-seeking receiver of the superheterodyne type which includes:
    a. local oscillator means having a plurality of frequency determining means for providing local oscillations of different frequencies corresponding to different channels;
    b. RF and IF signal handling means consisting of:
       1. a mixer coupled to said local oscillator for mixing received radio frequency signals with the local oscillations from said local oscillator means,
       2. RF signal receiving means for providing sufficient RF signal level for said mixer and
       3. IF and detector means for converting modulated intermediate frequency signals produced by said mixer to audio frequency signals;
    c. audio means for converting said audio frequency signals to sound for listening;
    d. a plurality of electrically operable visual indicators, there being one visual indicator associated with each of said frequency determining means;
    e. automatic stepping means which is defeatable and which has a plurality of outputs which are coupled to said oscillator means for automatically stepping said oscillator means through said given plurality of frequency determining means and operating each of said visual indicators when its associated frequency determining means is operative;
    f. locking means which is connected to the automatic stepping means for defeating said automatic stepping means as long as an RF signal is being received and allowing resumption of operation of said stepping means when no signal is being received;
g. squelch means for muting said audio means during automatic operation of said stepping means and
h. battery supply means for permitting the entire receiver to operate from batteries, the improvement which comprises additionally having
i. power cycling means for intermittently supplying power to at least a portion of said RF and IF signal handling means in synchrony with said automatic stepping means,
j. means for continuously supplying power to said automatic stepping means whereby power may be conserved without interfering with the operation of the signal-seeking function, and
k. in said automatic stepping means, an electronic stepping circuit having at least twice as many outputs as it has outputs which are coupled to said oscillator means and in which said power cycling means does not supply power when said automatic stepping means is sequenced to an output which is not coupled to said oscillator means.

12. The receiver of claim 11 in which said visual indicators include means for producing visible light when energized.

13. The receiver of claim 11 in which said power cycling means has a duty cycle of not more than 50%.

14. The receiver of claim 13 in which said automatic stepping means includes means for preventing any of its outputs from activating said oscillator means during at least 50% of the time the automatic stepping is in operation.

15. The receiver of claim 11 in which said locking means includes:

a. means for responding to the amount of audio frequency noise from the detector if the amount of such noise is below a threshold value.
b. means for adjusting the threshold value, and
c. means for defeating said means for responding at all times that power is not being supplied to said portion of said RF and IF signal handling means.

16. The receiver of claim 15 in which said power cycling means intermittently supplies power to the RF signal receiving means, mixer and IF and detector means.

17. The receiver of claim 16 in which said power cycling means intermittently supplies power at a constant periodic rate and at a duty cycle of essentially 50%.

18. The receiver of claim 17 in which said visual indicators include means for producing visible light when energized.

19. The receiver of claim 18 in which said visual indicators are a plurality of light emitting diodes, and which includes means for sequentially connecting said light emitting diode in series between said power supply means and said RF signal receiving means, mixer and IF and detector means.

20. The receiver of claim 11 in which said receiver includes a plurality of switches, there being one switch associated with each channel, each of said switches being operable to defeat fully powered operation of said RF and IF signal handling means when the receiver would otherwise be operating on the channel associated with the switch.

21. The receiver of claim 20 in which power is continuously supplied to said locking means and squelch during operation of said automatic stepping means.

* * * * *